(12) United States Patent
Ma et al.

(10) Patent No.: US 11,367,957 B2
(45) Date of Patent: Jun. 21, 2022

(54) FRONT-END MODULES WITH GROUND PLANE SLOTS

(71) Applicant: Hewlett-Packard Development Company, L.P., Spring, TX (US)

(72) Inventors: Chin-Hung Ma, Taipei (TW); Chien-Pai Lai, Taipei (TW); Chih Hung Chien, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/978,723

(22) PCT Filed: Jun. 7, 2018

(86) PCT No.: PCT/US2018/036370
§ 371 (c)(1),
(2) Date: Sep. 7, 2020

(87) PCT Pub. No.: WO2019/236085
PCT Pub. Date: Dec. 12, 2019

(65) Prior Publication Data
US 2021/0194128 A1    Jun. 24, 2021

(51) Int. Cl.
| | | |
|---|---|---|
| *H01Q 21/00* | (2006.01) |
| *H01Q 5/40* | (2015.01) |
| *H01Q 1/22* | (2006.01) |
| *H01Q 1/24* | (2006.01) |
| *H01Q 1/48* | (2006.01) |
| *H01Q 13/10* | (2006.01) |
| *H01Q 21/06* | (2006.01) |

(52) U.S. Cl.
CPC .............. *H01Q 5/40* (2015.01); *H01Q 1/2258* (2013.01); *H01Q 1/2283* (2013.01); *H01Q 1/241* (2013.01); *H01Q 1/48* (2013.01); *H01Q 13/10* (2013.01); *H01Q 21/065* (2013.01)

(58) Field of Classification Search
CPC ...... H01Q 5/40; H01Q 1/2258; H01Q 1/2283; H01Q 1/241; H01Q 1/48; H01Q 13/10; H01Q 21/065; H01Q 1/243; H05K 2201/10098; H05K 1/165; H05K 1/0224
USPC ........................................................ 343/725
See application file for complete search history.

(56) References Cited

U.S. PATENT DOCUMENTS

| | | | | |
|---|---|---|---|---|
| 6,317,094 B1 * | 11/2001 | Wu | ....... | H01Q 13/085 |
| | | | | 343/767 |
| 7,274,340 B2 * | 9/2007 | Ozden | ........ | H01Q 1/243 |
| | | | | 343/700 MS |

(Continued)

FOREIGN PATENT DOCUMENTS

CN           101938032        1/2011

*Primary Examiner* — Jean B Jeanglaude
(74) *Attorney, Agent, or Firm* — HPI Patent Department

(57) ABSTRACT

An example radio frequency (RF) front-end module may include a printed circuit board (PCB) including a ground plane, an RF integrated circuit (RFIC) including RF components mounted on the PCB, and an antenna array on the PCB. The antenna array may operate at a first resonant frequency in a wireless communication network. Further, the RF front-end module may include a slot defined in the ground plane to provide a second resonant frequency in the wireless communication network. The second resonant frequency is lower than the first resonant frequency.

15 Claims, 3 Drawing Sheets

(56) References Cited

U.S. PATENT DOCUMENTS

| | | | |
|---|---|---|---|
| 8,319,695 B2* | 11/2012 | Rofougaran | H01Q 9/065 343/750 |
| 8,988,299 B2 | 3/2015 | Kam et al. | |
| 9,172,132 B2 | 10/2015 | Kam et al. | |
| 9,537,210 B2* | 1/2017 | Tatomirescu | H04B 1/40 |
| 10,170,838 B2* | 1/2019 | Garcia | G06K 19/07749 |
| 2008/0198082 A1 | 8/2008 | Soler Castany et al. | |
| 2009/0009405 A1* | 1/2009 | Rofougaran | H01Q 1/38 343/700 MS |
| 2009/0009408 A1* | 1/2009 | Rofougaran | H01L 25/16 343/702 |
| 2010/0190464 A1 | 7/2010 | Chen et al. | |
| 2011/0254741 A1* | 10/2011 | Ishimiya | H01Q 1/243 343/702 |
| 2015/0214635 A1* | 7/2015 | Kwon | H01Q 5/371 343/853 |
| 2016/0172761 A1* | 6/2016 | Garcia | H01Q 21/28 343/700 MS |
| 2016/0306034 A1 | 10/2016 | Trotta et al. | |
| 2017/0194720 A1 | 7/2017 | Duan et al. | |
| 2017/0250720 A1 | 8/2017 | Michaeli et al. | |
| 2017/0290047 A1 | 10/2017 | Islam et al. | |
| 2018/0076526 A1* | 3/2018 | Garcia | G06K 19/07749 |

\* cited by examiner

US 11,367,957 B2

FRONT-END MODULES WITH GROUND PLANE SLOTS

BACKGROUND

The use of wireless terminals is on the rise in electronic devices such as mobile phones, notebooks, tablets, personal digital assistants (PDAs), or other devices having wireless connectivity capability. The rise in wireless devices with Internet connectivity may have posed a demand for higher data throughput to allow users to experience multimedia and video streaming. To address the increasing demand for the higher data rates, fifth generation (5G) of wireless standards may be introduced to provide an increased data throughput compared to the current fourth generation (4G) standard speeds through the utilization of several new enabling technologies. The 5G communications may depend on high frequencies referred to as the millimeter waves. The next generation of local area network (LAN) and wide area network (WAN) systems may be expected to rely on the millimeter waves in addition to currently used frequency bands below 6 GHz.

BRIEF DESCRIPTION OF THE DRAWINGS

Examples are described in the following detailed description and in reference to the drawings, in which.

DETAILED DESCRIPTION

Figure 1A:
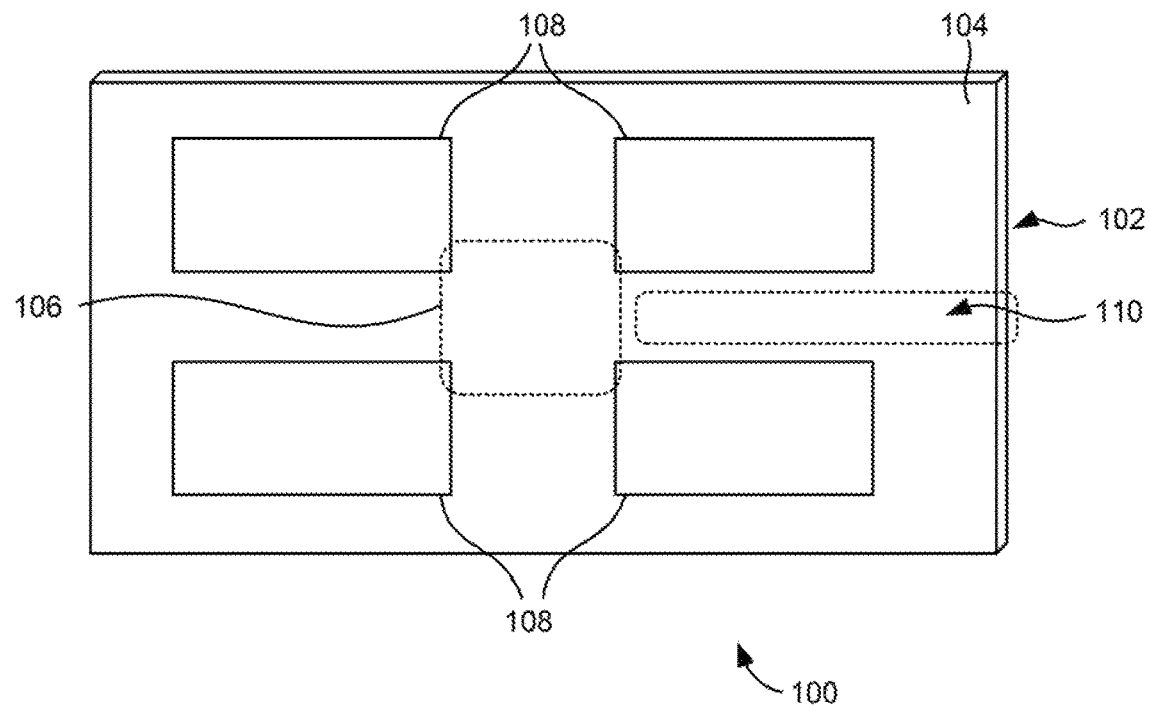
FIG. 1A is a schematic view of an example radio frequency (RF) front-end module, depicting a printed circuit board (PCB) with a ground plane slot.

Electronic devices such as mobile phones, notebooks, tablets, personal digital assistants (PDAs), or the like may have wireless connectivity capability. The number of users connecting to the Internet via the wireless electronic devices is on the rise, for instance, to chat with friends and family, watch videos, listen to streamed music, and indulge in virtual or augmented reality experiences. As a result, the data traffic may continue to grow at unprecedented rates. In order to address the continuously growing wireless capacity challenge, the wireless industry is moving to a fifth generation (5G) of wireless standards. The 5G communications may be implemented through utilization of several new enabling technologies such as the massive multiple-input multiple-out (MIMO) technology. The 5G communications may be utilized in different frequency bands such as millimeter wave (mmWave) and sub-6 GHz applications. The sub-6 GHz applications may provide a broad network coverage compared to the millimeter wave applications.

Further, the electronic devices with 5G communication capability may be expected to use millimeter wave antennas and sub-6 GHz antennas in addition to currently employed antennas such as LTE wireless wide area network (WWAN) antennas and wireless local area network (WLAN) antennas. To place an antenna in an electronic device, three factors may need to be considered, i.e., an antenna dimension, keep out area, and grounding. Based on the three factors, a significant amount of space may need to be reserved in the electronic devices in order to place the millimeter wave antennas and sub-6 GHz antennas along with the currently employed antennas. In an example scenario, the 5G antenna implementation may need an additional 4 antennas (e.g., two 5G millimeter wave antennas and two 5G sub-6 GHz antennas) along with two or four LTE WWAN (4G) antennas and two WLAN antennas. This can consume a significant amount of space for placing the antennas on the electronic devices, and hence may result in an increased size (e.g., a length, breadth, and/or thickness) of the electronic devices.

Examples described herein may combine a sub-6 GHz antenna with a millimeter wave radio frequency (RF) front-end module to reduce a number of antennas in electronic devices (e.g., portable computers) with 5G communication capability. Reducing the number of antennas can save the antenna space in the electronic devices. Further, reducing the antenna space can in turn save the wireless electronic devices' space. Examples described herein may provide a co-existence solution to enable the millimeter wave RF front-end module to implement the sub-6 GHz function without a dimension change in the RF front-end module. Examples described herein may reduce the antenna dimension by using a high frequency antenna array ground as a part of a low frequency antenna radiator.

In the following description, for purposes of explanation, numerous specific details are set forth in order to provide a thorough understanding of the present techniques. It will be apparent, however, to one skilled in the art that the present apparatus, devices and systems may be practiced without these specific details. Reference in the specification to "an example" or similar language means that a particular feature, structure, or characteristic described is included in at least that one example, but not necessarily in other examples.

Examples described herein may provide a RF front-end module for a wireless communication network. The RF front-end module may include a printed circuit board (PCB) including a ground plane, an RF integrated circuit (RFIC) including RF components mounted on the PCB, and an antenna array on the PCB. The antenna array may operate at a first resonant frequency (e.g., corresponding to a millimeter wave band) in a wireless communication network. Further, the RF front-end module may include a slot defined in the ground plane to provide a second resonant frequency (e.g., corresponding to a sub-6 GHz wave band) in the wireless communication network.

Turning now to the figures, FIG. 1A is a schematic view of an example RF front-end module 100, depicting a PCB 102 with a ground plane slot (e.g., a slot 110). RF front-end module 100 may be used in an electronic device such as a cellular phone, a notebook, a tablet, a personal computer (PC), a personal digital assistant, or any other device having wireless connectivity capability.

RF front-end module 100 may include PCB 102 including a ground plane 104. Example PCB 102 may be a multi-layered PCB. Further, RF front-end module 100 may include an RF integrated circuit (RFIC) 106 including RF components mounted on PCB 102, for instance, via a layout trace. Example RF components may include any combination of power amplifiers, low noise amplifiers, filters, switches, and/or other components to process the millimeter wave signals and/or sub-6 GHz signals. As shown in FIG. 1A, RF components can be mounted on a top surface of PCB 102. In another example, RF components can be mounted on a bottom surface of PCB 102. Alternatively, the RF components can be integrated into PCB 102.

Further, RF front-end module 100 may include an antenna array 108 on PCB 102. Antenna array 108 may include a plurality of antenna elements. For example, each antenna element may include patches or two metal layers of a plurality of metal layers comprised within PCB 102 and separated by a dielectric substrate. In the example shown in the FIG. 1A, ground plane 104 (e.g., a metallic PCB ground) and antenna array 108 (e.g., a metallic PCB bottom) can be designed as the patch antennas. During operation, antenna array 108 may operate at a first resonant frequency in a wireless communication network (e.g., a 5G wireless communication network).

Further, RF front-end module 100 may include a slot 110 defined in ground plane 104 to provide a second resonant frequency in the wireless communication network. The second resonant frequency may be lower than the first resonant frequency. In one example, the first resonant frequency may correspond to a millimeter wave band in the 5G wireless communication network. In another example, the second resonant frequency may correspond to a sub-6 GHz wave band in the 5G wireless communication network. For example, signals associated with the millimeter wave band can be greater than 6 GHz and signals associated with the sub-6 GHz wave band can be less than 6 GHz.

Figure 1B:
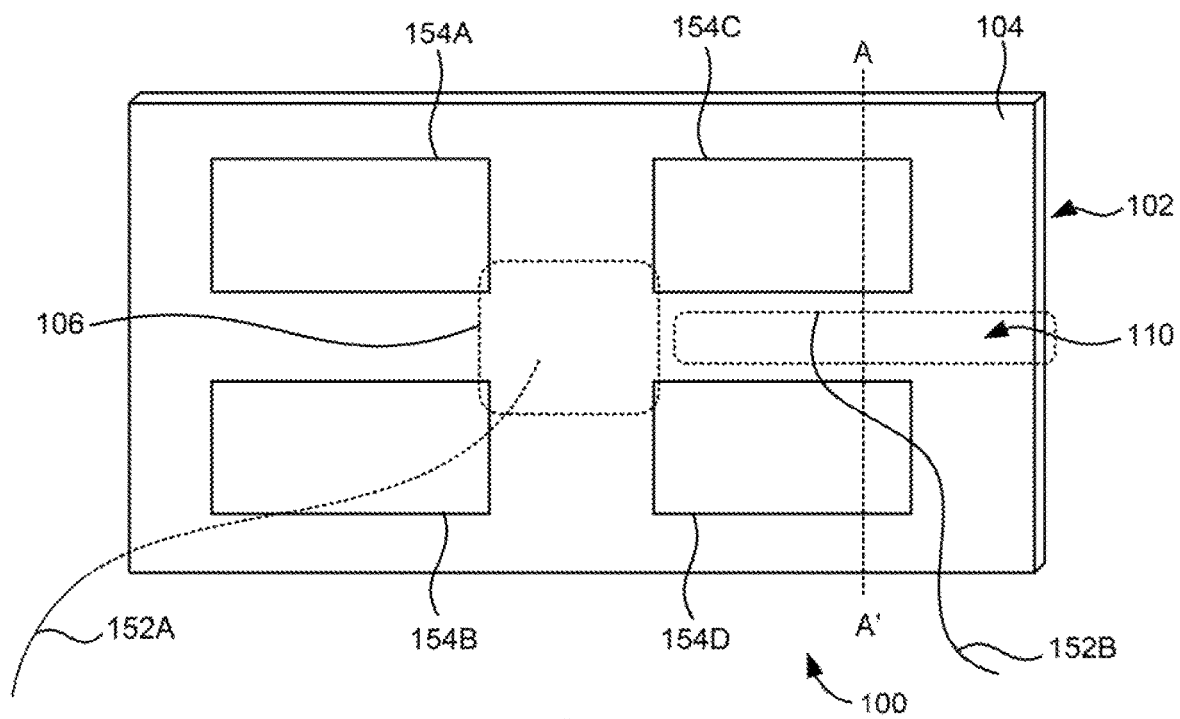
FIG. 1B is a schematic view of the example RF front-end module of FIG. 1A, depicting additional features.

FIG. 1B is a schematic view of example RF front-end module 100 of FIG. 1A, depicting additional features. As shown in FIG. 1B, slot 110 may have a dimension that corresponds to a quarter wavelength of the millimeter wave band. For example, slot 110 may have a length of about 12.5 millimeter, which corresponds to a quarter lambda (i.e., an electromagnetic wave length) of the sub-6 GHz wave band to provide the second resonant frequency.

As shown in FIG. 1B, the antenna array (e.g., antenna array 108 of FIG. 1A) may include antenna elements 154A-154D. Example antenna array 108 may include patch antennas. In the example shown in FIG. 1B, antenna elements 154A-154D may include four-millimeter wave antennas (e.g., massive input, massive output (MIMO) antennas) that can be used for a beamforming application in the 5G wireless communication network. Other examples can include any number of millimeter wave antennas that can be used for the beamforming application such as eight, sixteen, or the like. In MIMO applications, the antennas may be separated to take advantage of spatial diversity and the resulting different channel characteristics. In other examples, antenna array 108 may include dipole antennas, monopole antennas, loop antennas, microstrip antennas, or other types of antennas suitable for transmission of RF signals.

Further as shown in FIG. 1B, RF front-end module 100 may include a first coaxial feed 152A connected to a location on antenna array 108 to cause antenna array 108 to resonate at the first resonant frequency. Furthermore, RF front-end module 100 may include a second coaxial feed 152B connected to a location on ground plane 104 corresponding to slot 110 to cause slot 110 to resonate at the second resonant frequency. Second coaxial feed 152B can be an example to provide a coupling signal (e.g., sub-6 GHz signal with a center frequency of 3.5 GHz) to slot 110 (e.g., slot antenna structure).

Figure 2A:
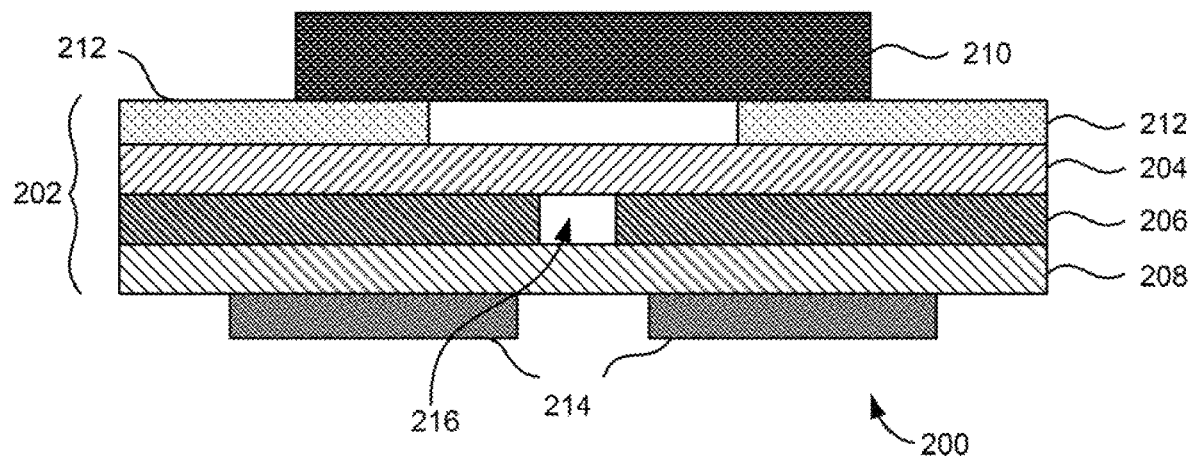
FIG. 2A is a cross-sectional side view of an example RF front-end module, depicting an antenna array and a ground plane slot to provide first and second resonant frequencies in a wireless communication network.

FIG. 2A is a cross-sectional side view of an example RF front-end module 200, depicting an antenna array 214 and a ground plane slot (i.e., a slot 216) to provide first and second resonant frequencies in a wireless communication network. For example, FIG. 2A is the cross-sectional side view taken along line A-A' of RF front-end module 100 of FIG. 1B. In one example, RF front-end module 200 may include a multi-layered PCB 202. Further, multi-layered PCB 202 may include a first layer 204, a second layer 206, and a third layer 208. In one example, second layer 206 may include a metallic ground plane and third layer may include a dielectric substrate (e.g., a ceramic substrate). Example metallic ground plane may be formed from a metal, including, but not limited to, copper.

Further, RF front-end module 200 may include RF components 210 mounted on a surface of first layer 204. For example, RF components 210 may be mounted on the surface of first layer 204 using the surface-mount technology. In some examples, first layer 204 may be disposed between RF components 210 and the metallic ground plane of second layer 206. In one example, RF components 210 may be coupled via a layout trace 212 for connecting a signal to multi-layered PCB 202. For example, RF components 210 may be soldered to let the signal connected with multi-layered PCB 202. In some examples, layout trace 212 can be a metallic top layer of multi-layered PCB 202 to provide circuit connections for RF components 210.

Furthermore, RF front-end module 200 may include antenna array 214 integrated into multi-layered PCB 202 and separated from metallic ground plane of second layer 206 by the dielectric substrate. The metallic ground plane may function as an electrical ground for RF components 210 and antenna array 214. The dielectric substrate of third layer 208 may be disposed between antenna array 214 and the metallic ground plane of second layer 206 to provide an antenna radiation. In the example described in FIG. 2A, the metallic ground plane of second layer 206 and metallic bottom layer (e.g., antenna array 214) may be designed as patch antennas. Further, four patch antennas may be used for a beamforming application in the wireless communication network.

During operation, antenna array 214 may operate at a first resonant frequency in the wireless communication network. In one example, the first resonant frequency may correspond to a millimeter wave band in a 5G wireless communication network. For example, RF front-end module 200 including multi-layered PCB 202 (i.e., having a metallic ground plane) and RF components 210 can be used for the millimeter wave application.

In addition, RF front-end module 200 may include a slot 216 defined in the metallic ground plane of second layer 206 to provide a second resonant frequency in the wireless communication network. The second resonant frequency may be lower than the first resonant frequency. In one example, the second resonant frequency may correspond to a sub-6 GHz wave band in the 5G wireless communication network. In some examples, the slot may include a length of about 12.5 millimeter, which corresponds to a quarter lambda of a sub-6 GHz wave band to provide the second resonant frequency.

For example, the sub-6 GHz wave band may be defined for the 5G spectrum under 6 GHz which can include, but not limited to, 600 MHz, 700 MHz, 800 MHz, 900 MHz, 1700 MHz, 1800 MHz, 2100 MHz, 2.3 GHz, 2.7 GHz, 3.5 GHz, or 5-6 GHz. In one example, the second resonant frequency for the slot length of 12.5 millimeter may provide a center frequency of 3.4 GHz. In another example, the millimeter wave band may be defined for the 5G spectrum which is higher than 6 GHz which can include, but not limited to, 24-28 GHz, 37-40 GHz, or 64-71 GHz.

Figure 2B:
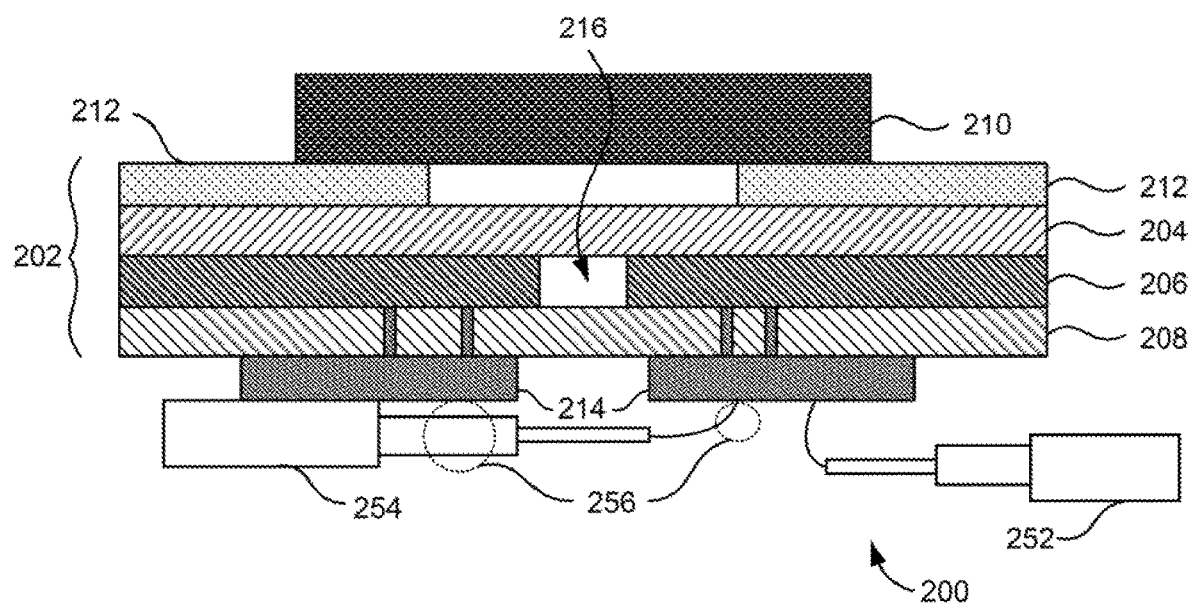
FIG. 2B is a cross-sectional side view of the example RF front-end module of FIG. 2A, depicting additional features.

FIG. 2B is a cross-sectional side view of example RF front-end module 200 of FIG. 2A, depicting additional features. As shown in FIG. 28, RF front-end module 200 may include a first coaxial feed 252 connected to a location on antenna array 214 to cause antenna array 214 to resonate at the first resonant frequency.

Further as shown in FIG. 28, RF front-end module 200 may include a second coaxial feed 254 connected to a location on the metallic ground plane of second layer 206 corresponding to slot 216 to cause slot 216 to resonate at the second resonant frequency. In some examples, second coaxial feed 254 may be soldered (e.g., at 256) to the metallic ground plane via antenna array 214.

Figure 3A:
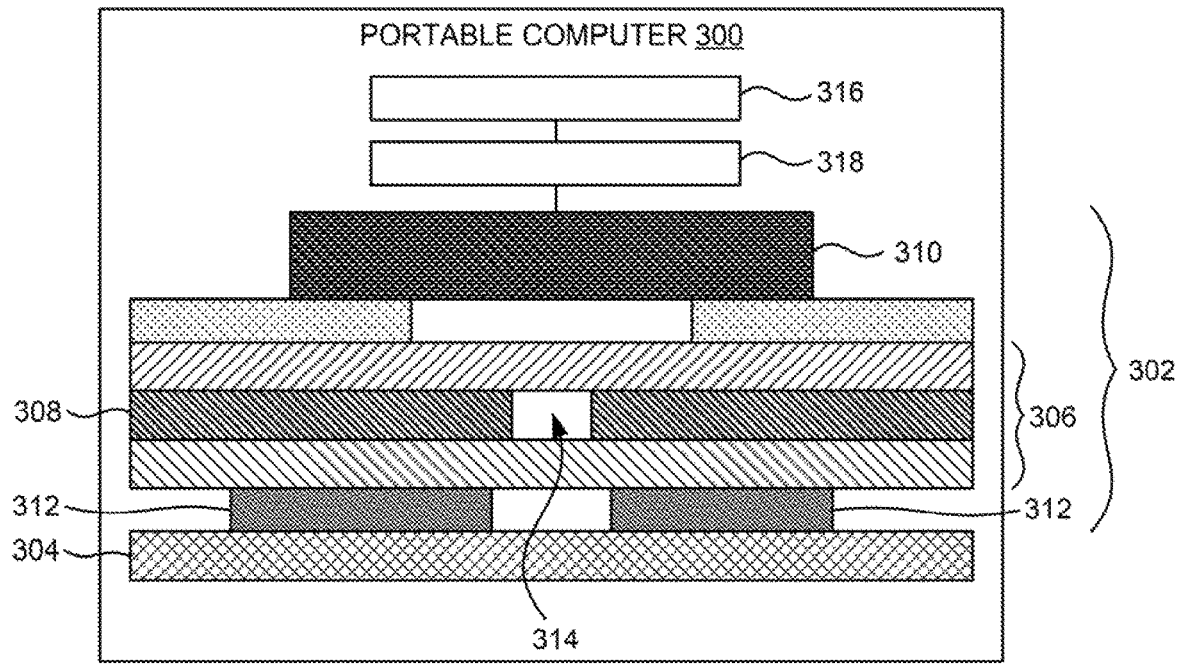
FIG. 3A is a schematic diagram of an example portable computer including an RF front-end module for a wireless communication network.

FIG. 3A is a schematic diagram of an example portable computer 300 including an RF front-end module 302 for a wireless communication network. RF front-end module 302 can be disposed inside a casing or chassis of portable computer 300. Example casing may be made up of a metal, plastic, or a carbon fiber. Example portable computer 300 may be a mobile phone, a tablet, a laptop, a desktop computer, a personal computer (PC), or the like. Example portable computer 300 may include a display (e.g., a touchscreen display). Example display may include liquid crystal display (LCD), light emitting diode (LED) display, electroluminescent (EL) display, or the like. In other examples, portable computer 300 may include a keyboard depending on a type of portable computer 300. Also, portable computer 300 may be equipped with other components such as a camera, an audio/video device, or the like depending on the functions of portable computer 300.

For example, portable computer 300 may include a display housing to house a display, a keyboard housing to house a keyboard, and a hinge assembly to pivotally, twistably, or detachably couple the display housing and the keyboard housing. The keyboard housing may also house a touchpad, battery, and the like. In another example, the display and the keyboard can be housed in a single housing. In yet another example, portable computer 300 can also be implemented without some of the components such as the keyboard and touchpad.

In portable computers, a significant amount of space may need to be reserved in order to place the millimeter wave antennas and sub-6 GHz antennas along with currently employed antennas for wireless communications. This can result in an increased size (e.g., a length, breadth, and/or thickness) of the portable computers.

Examples described herein may provide portable computer 300 having 5G communication capability, which combines a sub-6 GHz antenna with a millimeter wave radio frequency (RF) front-end module (e.g., RF front-end module 302) to reduce the number of antennas. Portable computer 300 may include a processor 316 and a transceiver 318 in communication with processor 316 to transmit and receive signals. Example processor 316 may be a general-purpose processor or a special-purpose processor.

In one example, processor 316 may control signal reception and signal transmission of transceiver 318. Processor 316 may execute a basic operating system program, stored in memory of portable computer 300, in order to control the overall operation of portable computer 300. Further, processor 316 may be capable of executing other processes and programs resident in the memory.

Further, portable computer 300 may include RF front-end module 302 in communication with transceiver 318. Furthermore, portable computer 300 may include a circuit board 304 to which RF front-end module 302 may be connected. Example circuit board 304 may be a mother board. Circuit board 304 may include a plurality of conductive lines to provide communication between RF front-end module 302 and components (e.g., processors, memories, interface cards, and the like) mounted to circuit board 304. In some examples, processor 316 may be a chip that can be either integral to circuit board 304 or external to circuit board 304 and connected via an interface.

In one example, RF front-end module 302 may include a substrate 306 including an embedded ground plane 308. Substrate 306 may be coupled to circuit board 304. For example, substrate 306 may be coupled to circuit board 304 via a plurality of electrically conductive bumps. Substrate 306 may be coupled to circuit board 304 using a variety of techniques, including, but not limited to, bump bonding. Further, RF front-end module 302 may include an RFIC 310 including RF components mounted on a surface of substrate 306. Example substrate 306 may be a multi-layered structure selected from a group consisting of a printed circuit board (PCB), a glass substrate, a ceramic substrate, or a semiconductor substrate.

Furthermore, RF front-end module 302 may include a plurality of antenna elements 312 positioned on substrate 306 and coupled to ground plane 308. Antenna elements 312 may operate at a first resonant frequency in a wireless communication network. Ground plane 308 may function as an electrical ground for antenna elements 312 and the RF components.

In addition, RF front-end module 302 may include a slot 314 defined in ground plane 308 to provide a second resonant frequency in the wireless communication network. The second resonant frequency may be lower than the first resonant frequency. In one example, the first resonant frequency may correspond to a millimeter wave band in a 5G wireless communication network and the second resonant frequency may correspond to a sub-8 GHz wave band in the 5G wireless communication network.

Figure 3B:
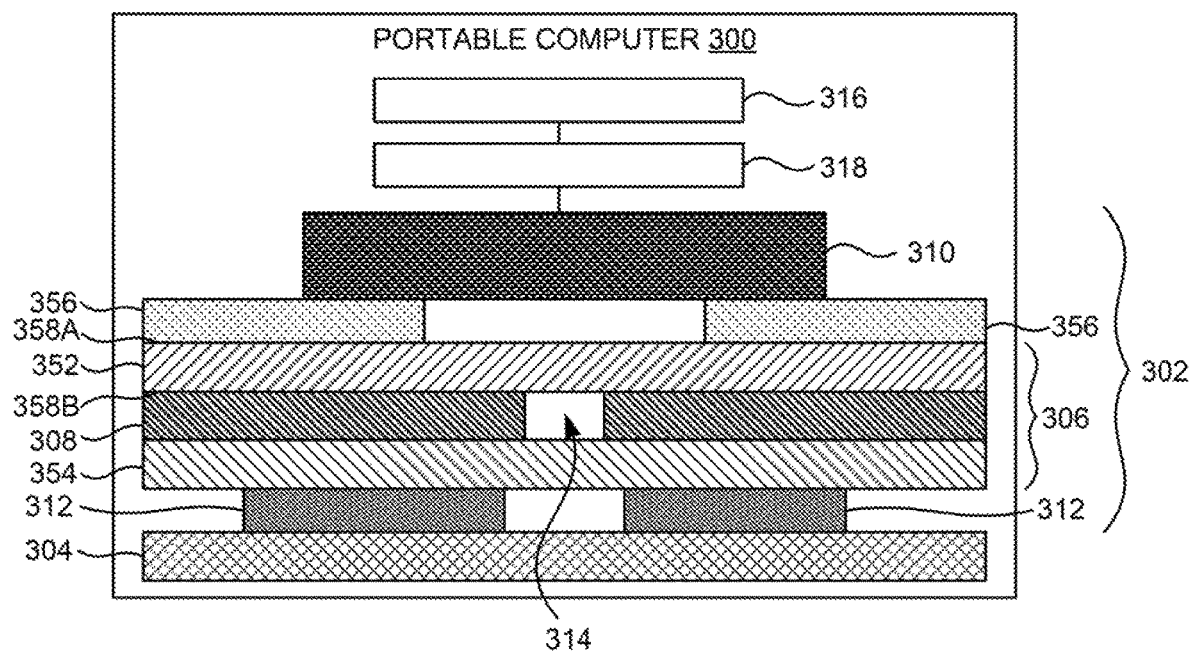
FIG. 3B is a schematic diagram of the example portable computer of FIG. 3A, depicting additional features.

FIG. 3B is a schematic diagram of example portable computer 300 of FIG. 3A, depicting additional features. Particularly, FIG. 3B illustrates an example multi-layer structure of substrate 306. As shown in FIG. 3B, substrate 306 may include a first layer 352 having a first surface 358A and a second surface 358B opposite first surface 358A. Further, RFIC 310 may be mounted on first surface 358A via a layout trace 356 and ground plane 308 may be positioned on second surface 358B.

Further as shown in FIG. 3B, substrate 306 may include an insulating layer 354 on ground plane 308 such that ground plane 308 may be positioned between second surface 358B and insulating layer 354. Furthermore, antenna elements 312 may be positioned on insulating layer 354 such that insulating layer 354 may be positioned between antenna elements 312 and ground plane 308. Example antenna elements 312 may be patch antennas. A patch antenna may include a flat "patch" of metal mounted over a ground plane and separated by some dielectric material. For example, a patch antenna may be formed of a metal patch (i.e., antenna elements 312), ground plane 308, and insulating layer 354.

Thus, examples described herein may combine the 5G millimeter wave and the 5G sub-8 GHz to reduce the number of antennas, which in turn reduce an amount of space involved in placing the antennas for 5G communications. In some examples, the multi-layer structure of a PCB (e.g., PCB 202 of FIGS. 2A and 2) or a substrate (e.g., substrate 306 of FIGS. 3A and 3) can include any number of layers provided that the millimeter wave RF front-end module includes a metallic ground plane.

It may be noted that the above-described examples of the present solution are for the purpose of illustration only. Although the solution has been described in conjunction with a specific implementation thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract, and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. A radio frequency (RF) front-end module comprising:
    a printed circuit board (PCB) including a ground plane;
    an RF integrated circuit (RFIC) including RF components mounted on the PCB;
    an antenna array on the PCB, wherein the antenna array is to operate at a first resonant frequency in a wireless communication network; and
    a slot defined in the ground plane to provide a second resonant frequency in the wireless communication network, wherein the second resonant frequency is lower than the first resonant frequency.

2. The RF front-end module of claim 1, wherein the first resonant frequency corresponds to a millimeter wave band in a 5G wireless communication network.

3. The RF front-end module of claim 1, wherein the second resonant frequency corresponds to a sub-6 GHz wave band in a 5G wireless communication network.

4. The RF front-end module of claim 1, wherein the slot has a dimension that corresponds to a quarter wavelength of a millimeter wave band.

5. The RF front-end module of claim 1, wherein the antenna array comprises a plurality of antenna elements, and wherein each antenna element comprises patches or two metal layers of a plurality of metal layers comprised within the PCB and separated by a dielectric substrate.

6. The RF front-end module of claim 1, further comprising:
    a first coaxial feed connected to a location on the antenna array to cause the antenna array to resonate at the first resonant frequency; and
    a second coaxial feed connected to a location on the ground plane corresponding to the slot to cause the slot to resonate at the second resonant frequency.

7. A radio frequency (RF) front-end module comprising:
    a multi-layered printed circuit board (PCB) comprising:
        a first layer;
        a second layer comprising a metallic ground plane; and
        a third layer comprising a dielectric substrate;
    RF components mounted on a surface of the first layer, wherein the RF components are coupled via a layout trace to connect a signal to the multi-layered PCB;
    an antenna array integrated into the multi-layered PCB and separated from the metallic ground plane by the dielectric substrate, wherein the antenna array is to operate at a first resonant frequency in a wireless communication network; and
    a slot defined in the metallic ground plane to provide a second resonant frequency in the wireless communication network, wherein the second resonant frequency is lower than the first resonant frequency.

8. The RF front-end module of claim 7, wherein the first resonant frequency corresponds to a millimeter wave band in a 5G wireless communication network, and wherein the second resonant frequency corresponds to a sub-6 GHz wave band in the 5G wireless communication network.

9. The RF front-end module of claim 7, wherein the metallic ground plane is to function as an electrical ground for the RF components and the antenna array, wherein the first layer is disposed between the RF components and the metallic ground plane, and wherein the dielectric substrate is disposed between the antenna array and the metallic ground plane to provide an antenna radiation.

10. The RF front-end module of claim 7, wherein the slot has a length of about 12.5 millimeter, which corresponds to a quarter lambda of a sub-6 GHz wave band to provide the second resonant frequency.

11. A portable computer comprising:
    a processor;
    a transceiver in communication with the processor to transmit and receive signals;
    a radio frequency (RF) front-end module in communication with the transceiver, wherein the RF front-end module comprising:
        a substrate including an embedded ground plane;
        an RF integrated circuit (RFIC) including RF components mounted on a surface of the substrate;
        a plurality of antenna elements positioned on the substrate and coupled to the embedded ground plane, wherein the plurality of antenna elements is to operate at a first resonant frequency in a wireless communication network; and
        a slot defined in the embedded ground plane to provide a second resonant frequency in the wireless communication network, wherein the second resonant frequency is lower than the first resonant frequency; and
    a circuit board to which the substrate is coupled.

12. The portable computer of claim 11, wherein the substrate comprises a multi-layered structure selected from a group consisting of a printed circuit board (PCB), a glass substrate, a ceramic substrate, or a semiconductor substrate, and wherein the embedded ground plane is to function as an electrical ground for the plurality of antenna elements and the RF components.

13. The portable computer of claim 11, wherein the substrate comprises:
    a first layer having a first surface and a second surface opposite the first surface, wherein the RFIC is mounted on the first surface, and wherein the embedded ground plane is positioned on the second surface; and
    an insulating layer on the embedded ground plane such that the embedded ground plane is positioned between the second surface and the insulating layer, wherein the antenna elements are positioned on the insulating layer such that the insulating layer is positioned between the antenna elements and the embedded ground plane.

14. The portable computer of claim 11, wherein the first resonant frequency corresponds to a millimeter wave band in a 5G wireless communication network, and wherein the second resonant frequency corresponds to a sub-6 GHz wave band in the 5G wireless communication network.

15. The portable computer of claim 11, wherein the circuit board is a mother board, wherein the circuit board comprises a plurality of conductive lines to provide communication between the RF front-end module and components mounted to the circuit board.

\* \* \* \* \*